(12) United States Patent
Quan et al.

(10) Patent No.: US 10,505,550 B1
(45) Date of Patent: Dec. 10, 2019

(54) METHOD AND APPARATUS OF OPERATING SYNCHRONIZING HIGH-SPEED CLOCK DIVIDERS TO CORRECT CLOCK SKEW

(71) Applicant: Invecas, Inc., Santa Clara, CA (US)

(72) Inventors: Shaolei Quan, Santa Clara, CA (US); Vijay Gadde, Cupertino, CA (US); Prasad Chalasani, San Jose, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 16/268,206

(22) Filed: Feb. 5, 2019

(51) Int. Cl.
    *H03K 21/10* (2006.01)
    *H03K 21/02* (2006.01)
    *H03K 19/21* (2006.01)

(52) U.S. Cl.
    CPC ............. *H03K 21/10* (2013.01); *H03K 21/02* (2013.01); *H03K 19/21* (2013.01)

(58) Field of Classification Search
    CPC ...... H03K 21/02; H03K 21/026; H03K 21/08; H03K 21/10
    USPC .................................................. 327/115, 117
    See application file for complete search history.

(56) References Cited

U.S. PATENT DOCUMENTS 5,175,752 A * 12/1992 Yokomizo .............. H03K 23/50
    327/392
9,100,167 B2 * 8/2015 Garg ...................... H04L 7/0025

* cited by examiner

Primary Examiner — William Hernandez
(74) Attorney, Agent, or Firm — Venture Pacific Law, PC

(57) ABSTRACT

A synchronizing high-speed clock divider has a Clk input, a Clks input, and a reset input configured to correct phase misalignment on clock divider outputs caused by phase skew between a Clk input signal and a Clks input signal, and comprises a reset synchronizer configured to generate at least one synchronous internal reset signal in response to a reset signal and the Clk input signal, a first clock divider configured to receive the Clk input signal on the Clk input and a reset signal on a first clock divider reset input to provide a Clk out signal, a second clock divider configured to receive the Clks input signal on the Clks input and the reset signal on a second clock divider reset input to provide a Clks out signal, a phase skew detector configured to detect a phase alignment between the Clk out signal and the Clks out signal, and a phase skew corrector coupled to the phase skew detector and the second clock divider configured to change the phase alignment to be within a same phase as the first clock divider. A key aspect of the clock divider is that once phase misalignment between the Clk and Clks out signals is detected, the phase misalignment is corrected.

20 Claims, 7 Drawing Sheets

METHOD AND APPARATUS OF OPERATING SYNCHRONIZING HIGH-SPEED CLOCK DIVIDERS TO CORRECT CLOCK SKEW

FIELD OF INVENTION

The disclosure generally relates to high-speed clock dividers, and more particularly to high-speed clock dividers that tolerate wide-range of clock skew in the field of high-speed ASIC design.

BACKGROUND

As chip complexity increases, faster chip clock rates and analog signal-integrity issues complicate digital design, and time-to-market pressures continue to shorten development schedules. These and other factors provide increasing challenges to digital-design engineers. More time and effort are needed to understand the timing analysis than what has been traditionally time spent for understanding software and other system level issues. In high-speed clocked circuit designs, it is often necessary to synchronize two clock dividers to provide outputs that are in phase when input clock signals to the two clock dividers are different but nominally in-phase clock signals. In practice, the two nominally in-phase clock signals can experience significant phase skew. Each clock signal may come from physically different buffer chains that can be subject to delays caused by random, systematic, and process variations. These non-idealities are often corrected to a very limited extent by the conventional scheme of synchronization using reset release.

FIG. 1 illustrates a block diagram of a prior art A clock divider 10 that includes a slave divider 12 and a master divider 14. In general, the slave divider 12 and the master divider 14 are retimed or synchronized with a master clock by using the master clock to generate a synchronized reset signal, rst1, from asynchronous input reset signal, reset, for resetting both the slave divider 12 and the master divider 14. Slave input clock, Clks, is coupled to clock input of the slave divider 12. Master input clock, Clk, is coupled to an input of buffer 19 with the output of the buffer 19 coupled to clock inputs of delay buffer 16 and delay buffer 18. It should be noted the delay buffers are similar to D-type flip flops. A reset signal is coupled to a data input of the delay buffer 16. Output of delay buffer 16 is coupled to a data input of the delay buffer 18. Output of delay buffer 18 provides a rst1 signal to a reset input of the slave divider 12 and a reset input of the master divider 14. In operation, it can be determined that input Clk signal is delayed through buffer 19 before clocking the reset signal through the delay buffer 16 and the delay buffer 18 to reset the slave divider 12 and reset the master divider 14. Once reset changes from active (high signal) to inactive (low signal), clock signal Clks applied to slave divider 12 provides a Clks_out signal and the clock signal Clk applied to master divider 14 provides a Clk_out signal. The Clks_out signal and the Clk_out signal are in phase when the timing of rst1 changing from active to inactive satisfies the requirements of both master divider and slave divider with respect to clk and clks signals for the prior art A clock divider 10.

FIG. 2 illustrates a block diagram of a prior art B clock divider 20 that includes a slave divider 12, and a master divider 14. The prior art B clock divider 20 is similar to the prior art A clock divider 10 but includes additional time delay element 1 22, and time delay element 2 24. The time delay element 1 22 is coupled between the rst1 signal and the reset input of the slave divider 12. The time delay element 2 24 is coupled between the rst1 signal and the reset input of the master divider 14. In operation, the additional delay presented by time delay element 1 22 and time delay element 2 24 are implemented based upon testing and calculation to compensate for systematic phase skew between the Clks_out signal and the Clk_out signal to satisfy the timing requirements of the master clock divider and the slave clock divider on reset input.

FIG. 1 and FIG. 2 illustrate prior art implementations of how present circuit designers are coping with solutions to compensate for systematic phase skew. Predetermined delays are purposely introduced into the clock dividers to compensate for the systematic phase skew between the Clk and Clks signals; timing margin on reset input of both clock dividers has to be large enough to accommodate the random variation in phase skew caused by circuit mismatch, process variation, and temperature variation. As clock speed rapidly rises in high-speed ASIC (Application Specific Integrated Circuit) design, and circuit variation becomes increasingly worse in deep-submicron technology nodes, achieving sufficient timing margin in circuit design to guard band the random variation in phase skew becomes a more and more difficult task.

FIG. 3 illustrates a timing diagram depicting clock phase skew scenarios for the prior art A and B clock dividers. Generally, there are two scenarios in which phase skew failure can occur between the two Clk and Clks waveforms. The first instance occurs when the Clk waveform is lagging in phase with the Clks (leading) waveform as shown by arrow 34, and the second instance occurs when the Clk waveform leads in phase with the Clks waveform or Clks (lagging) waveform as shown by arrow 32. To better illustrate the phase skew failures of the clock dividers, a non-failure scenario is first explained. Clk waveform and Clks (nominal) waveform are close in phase as illustrated in the timing diagram of FIG. 3. The prior art clock divider receives a reset signal to begin operation. As the Clk waveform is applied, the rst1 signal is active at tsu1. At the next rising edge of the Clk waveform at tsu1 and Clks (nominal) waveform at tsu2, the master divider provides clk_out signal and the slave divider provides clks_out (nominal) signal, both clk_out signal and clks_out (nominal) signal are in phase as indicated by tsu1 arrow and tsu2 arrow, respectively. It should be noted that the clock dividers in the current examples are by-two clock dividers.

In a next scenario, the Clk waveform lags the Clks (leading) waveform or alternatively, the Clks (leading) waveform leads the Clk waveform. The Clk waveform produces the Clk_out waveform like the previous scenario as indicated by the tsu1 arrows. Referring to the Clks (leading) waveform 34 in the timing diagram of FIG. 3 at tsu3, the rising edge of the Clks (leading) waveform occurs too early for proper setup time. Setup time can be defined as the minimum amount of time that data must be stable for the data to be latched correctly before a clock's active (rising or falling) edge. Any violation may cause incorrect data to be captured causing a setup time violation. In the present scenario, the rising edge of a clock is used as the active edge. Those skilled in the art will realize that it is designer's choice to implement either rising or falling edge as the triggering clock edge. When the Clks (leading) waveform occurs too early, a setup violation can occur wherein an initial rising edge of the Clks (leading) waveform will not produce valid data. However, if the Clks (leading) waveform does not cause a setup time violation, the slave divider Clks_out waveform is in phase with the Clk_out waveform in this scenario as shown by dotted line 36. It should be noted that there are scenarios in which the Clks (leading) waveform does not produce an in phase Clks_out waveform. When the Clks (leading) waveform does cause a setup time violation at the slave divider, the slave divider Clks_out waveform is out of phase with the Clk_out waveform as shown by dotted line 38 as failure.

In another scenario, the Clk waveform leads the Clks (lagging) waveform. The lagging Clks (lagging) waveform 32 can cause phase skew between the Clk_out signal and Clks_out signal. Referring to the timing diagram of FIG. 3, the Clk waveform produces the Clk_out waveform like the previous scenario as indicated by the tsu1 arrows. However, the Clks (lagging) waveform will occur too late. When the rst1 signal is applied to the dividers, there may not be sufficient hold time with respect to Clks (lagging) waveform for the slave divider to obtain valid output. Hold time defines the minimum required time that a signal must maintain its signal state after active edge of the clock. Until the hold time requirement is met, any sampling of the data may not be valid. In this scenario, the Clks (lagging) waveform toggles the slave divider output in substantially the same cycle the rst1 signal changes from active state to inactive state, resulting in invalid output from the slave divider and phase misalignment between Clks_out and Clk_out as shown by arrow 37. However, if the Clks (lagging) waveform does not lag as much, then there is sufficient hold time for the rst 1 signal to become a valid low signal. At the next period of the Clks (lagging) waveform at tsu4, the applied Clks (lagging) waveform will produce a Clks_out (good) waveform that has phase alignment with Clk_out as shown by dotted line 39.

As clock speeds exceed 12.5 Ghz, the reduced timing margin applied to the conventional synchronization scheme quickly becomes even more inaccurate and unworkable. The problem is further magnified at deep technology nodes of 14 nm and below when the variation in transistors and interconnect characteristics gets even more magnified.

Accordingly, there is a need for an apparatus and a method of synchronizing high-speed clock dividers that overcomes limitations of failure due to reduced timing margin caused by clock skew using conventional synchronization schemes.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is also appreciated that the terms such as "first", "second", "third", etc. are used to distinguish between elements such terms describe. These terms are not necessarily intended to indicate temporal or prioritization of such elements, unless otherwise explicitly stated.

In an embodiment of a synchronizing high-speed divider, the synchronizing high-speed clock divider has a Clk input, a Clks input, and a reset input configured to correct phase skew between a Clk signal and a Clks signal and comprises a reset synchronizer configured to generate at least one synchronous internal reset signal in response to a reset signal and the Clk signal, a first clock divider configured to receive the Clk signal on the Clk input and a reset signal on a first clock divider reset input to provide a Clk out signal, a second clock divider configured to receive the Clks signal on the Clks input and the reset signal on a second clock divider reset input to provide a Clks out signal, a phase skew detector coupled to the first clock divider and the second clock divider configured to detect a phase alignment between the Clk out signal and the Clks out signal, and a phase skew corrector coupled to the phase skew detector and second clock divider configured to change the phase alignment of the Clks out signal from the second clock divider to be within a same phase as the Clk out signal from the first clock divider in response to the phase skew detector detecting a phase misalignment between the Clk out signal and the Clks out signal.

In another embodiment of the synchronizing high-speed clock divider, the second clock divider further includes a Clks_divider_bar signal, and the phase skew corrector is configured to select the Clks_divider_bar signal to provide an output having the same phase as the first clock divider. Accordingly, the synchronizing high-speed clock divider not only detects phase skew between the Clk and Clks signals but also corrects the detected phase skew.

In yet another embodiment of the synchronizing high-speed clock divider, the phase skew detector comprises a D-type flip flop configured to receive a Clks_divider signal at a data input and the Clk_divider signal at a clock input of the D-type flip flop to detect phase skew.

Figure 1:
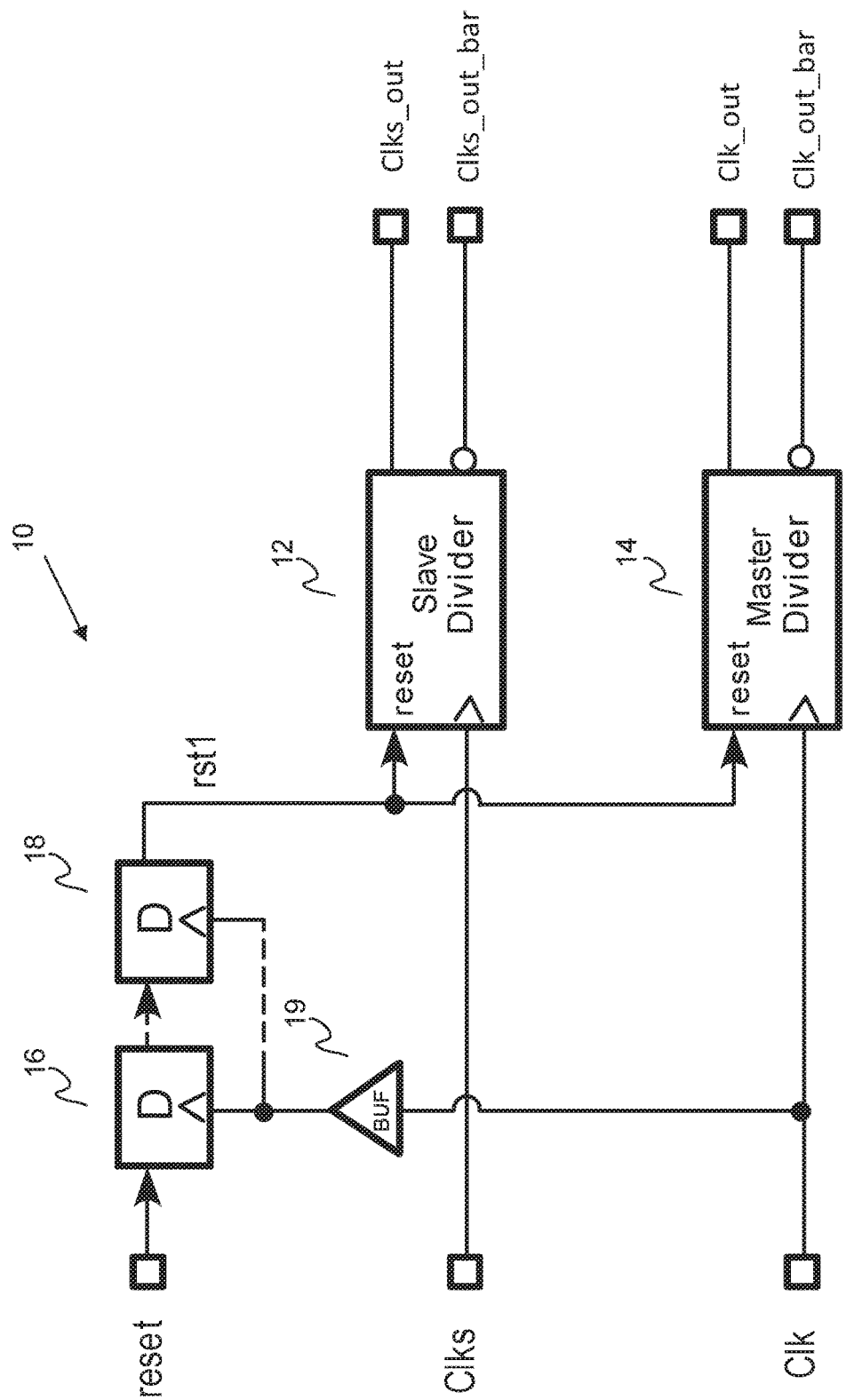
FIG. 1 illustrates a block diagram of a prior art A clock divider.
Figure 2:
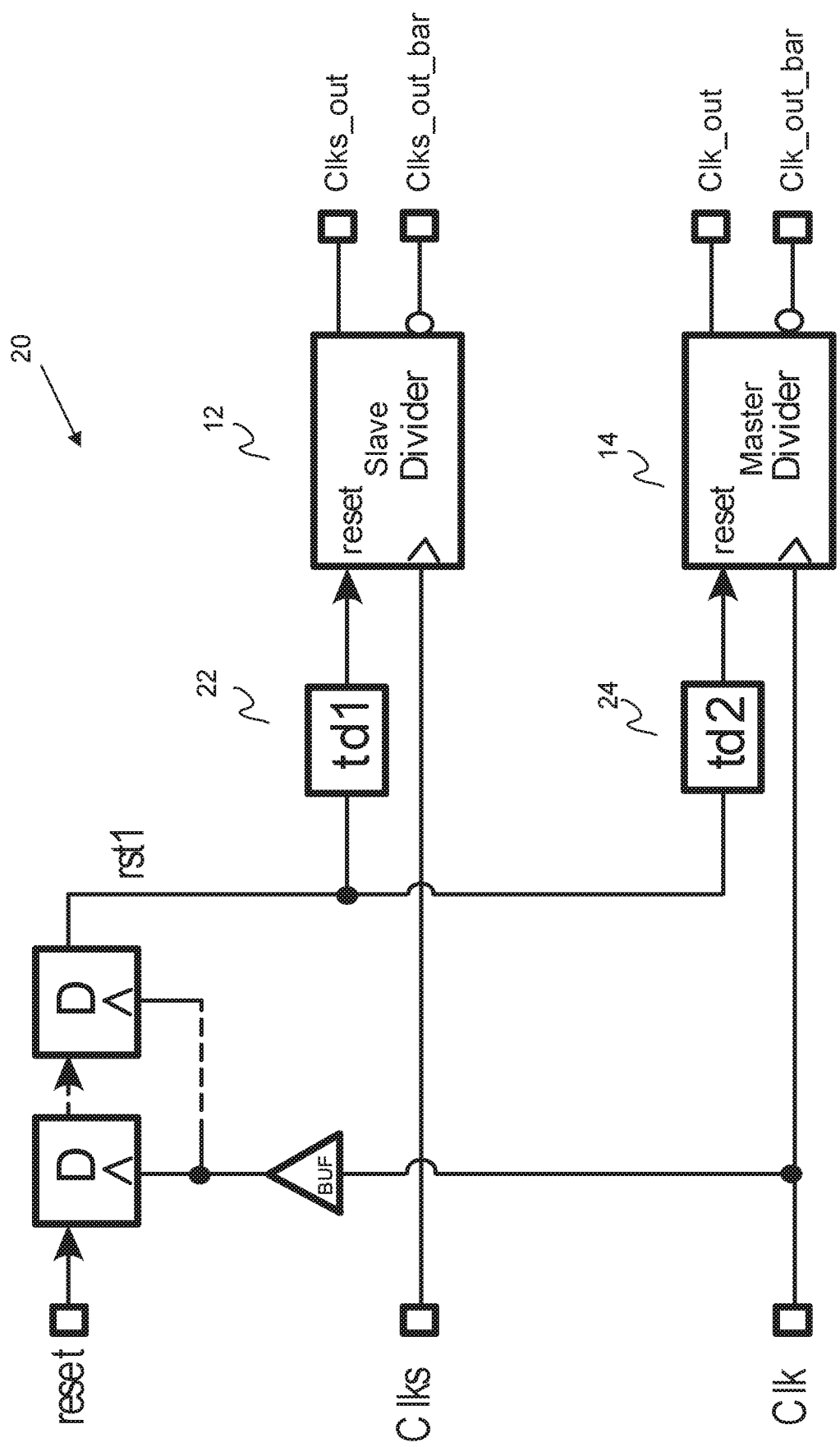
FIG. 2 illustrates a block diagram of a prior art B clock divider.
Figure 3:
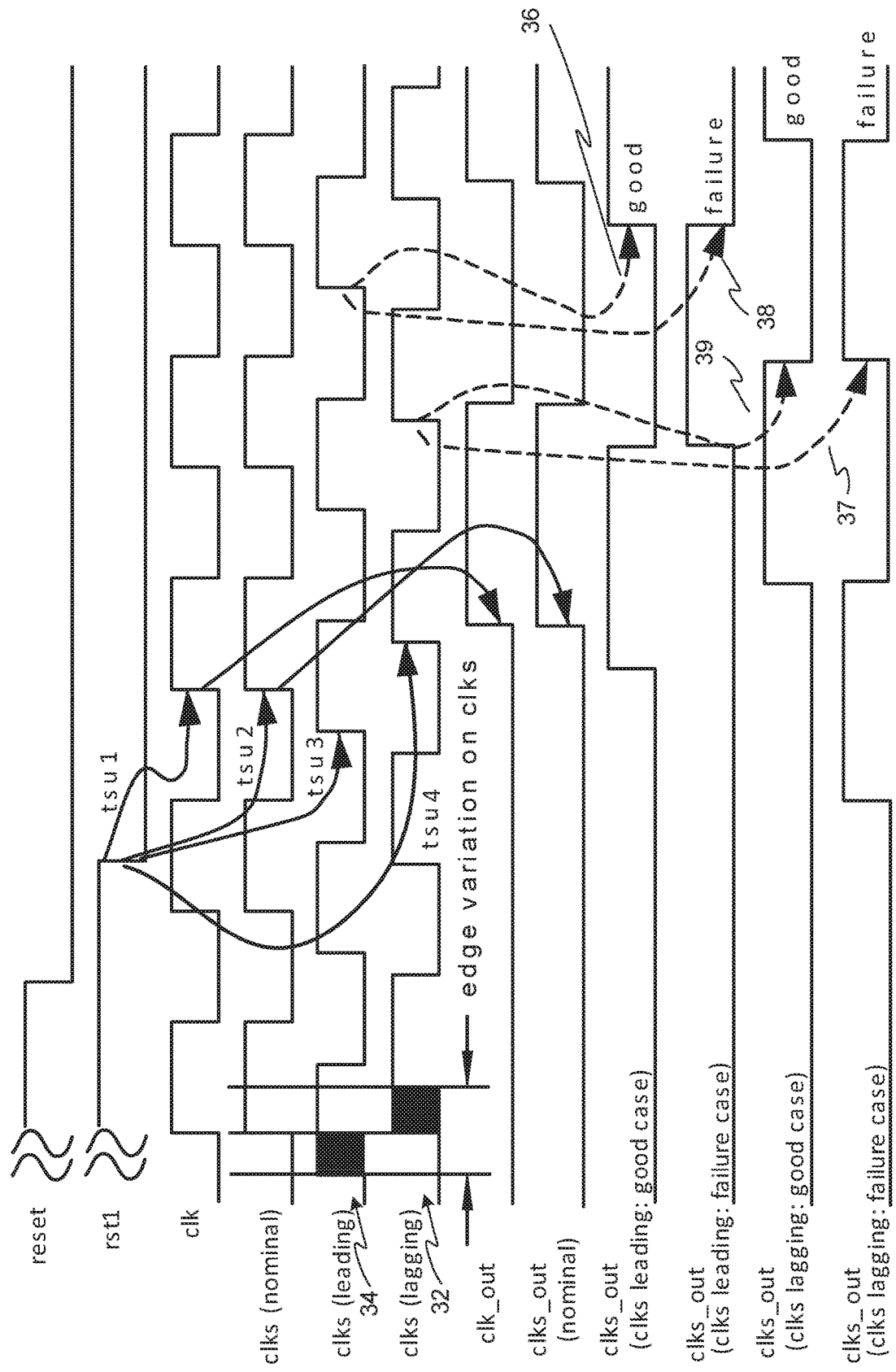
FIG. 3 illustrates a timing diagram depicting clock phase skew scenarios for the prior art A and B clock dividers.
Figure 4:
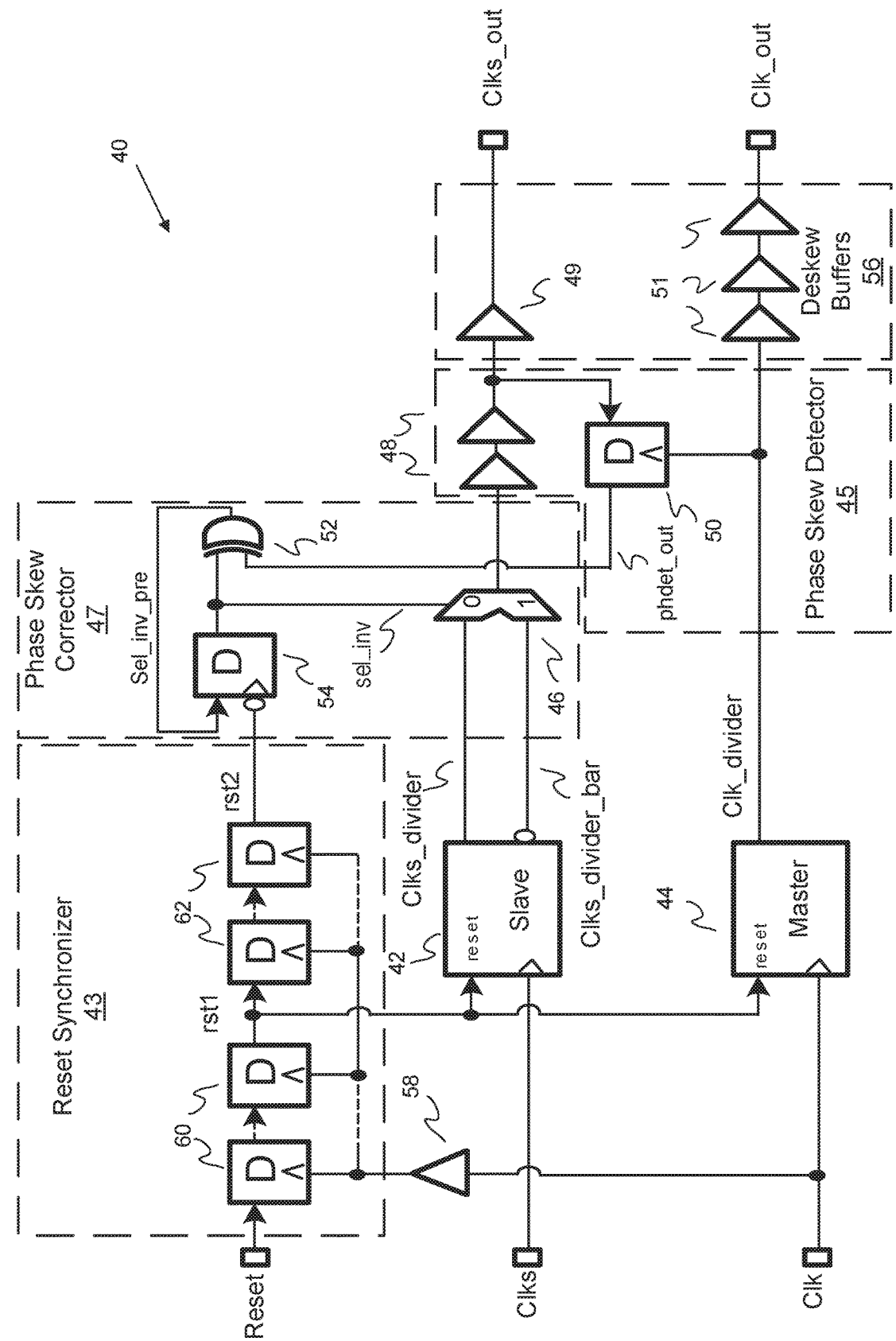
FIG. 4 illustrates a block diagram of an embodiment of a synchronizing high-speed divider in accordance with the present invention.

FIG. 4 illustrates a block diagram of an embodiment of a synchronizing high-speed divider 40 in accordance with the present invention. In general, the synchronizing high speed divider 40 includes a slave clock divider (also called a second clock divider) 42, a master clock divider (also called a first clock divider) 44, a reset synchronizer 43 coupled to the clock dividers to synchronize the two clock dividers, a phase skew detector 45 coupled to the outputs of the slave clock divider 42 and the master clock divider 44 and coupled to an input of a phase skew corrector 47 wherein the phase skew corrector 47 selects an inverted slave clock divider 42 output in response to the phase skew detector 45 detecting a phase skew between output Clks_divider of the slave clock divider 42 and output Clk_divider of the master clock divider 44. At least one serially coupled buffer 48 is coupled to the output of mux 46 of the phase skew corrector 47. The at least one serially coupled buffer 48 is coupled to an output buffer 49 to provide a Clks_out. Serially coupled buffers 51 of the deskew buffers 56 are coupled to Clk_out. The output of the at least one serially coupled buffer 48 is also coupled to a data input of a D-type flip flop 50 of the phase skew detector 45, and the D-type flip flop receives a clock input from the master clock divider 44 Clk_divider output to detect phase skew. The master clock divider 44 Clk_divider output is serially coupled to at least one buffer 51 of the clock deskew buffers unit 56 to provide the output Clk_out.

The slave clock divider 42 has a Clks input, a reset input, a Clks divider output, and a Clks_divider_bar output. It should be noted that the Clks_divider_bar output is the complement or inverse of the Clks_divider output. A mux 46 has a first input coupled to the Clks_divider output and a second input coupled to the Clks_divider_bar output. The output of mux 46 is serially coupled to the at least one serially coupled buffer 48 of the phase skew detector 45 which provides an output to buffer 49 of the deskew buffers 56 to output Clks_out. The output of the at least one serially coupled buffer 48 is also coupled to a data input of a D-type flip flop 50 of the phase skew detector 45. The master clock divider 44 has a Clk input, a reset input, and a Clk divider output. The Clk divider output is coupled to the clock input of the D-type flip flop 50 of the phase skew detector 45 to detect phase skew and to serially coupled buffers 51 of the deskew buffers 56 to provide the output Clk_out. The output of the D-type flip flop 50 provides a phdet_out signal that is coupled to a first input of an XOR gate 52 of the phase skew corrector 47. The output of the XOR gate 52 provides a sel_inv_pre signal that is coupled to a data input of a D-type flip flop 54 of the phase skew corrector 47. The output of the D-type flip flop 54 provides a sel_inv signal that is coupled to a second input of the XOR gate 52 and to a selection input of the mux 46 to select the Clks_divider_bar output of the slave clock divider 42 to correct phase skew when the phase skew detector 45 detected phase skew.

The Clk input signal of the master clock divider 44 is also coupled to buffer 58. A reset signal for a reset synchronizer 43 is coupled to a data input of at least one daisy chained D-type flip flop 60 having the output of buffer 58 coupled to a clock input of the at least one D-type flip flop 60 of the reset synchronizer 43. The output of the at least one D-type flip flop 60 provides a rst1 output that is coupled to the reset inputs of the slave clock divider 42 and the master clock divider 44 that synchronizes the slave clock divider 42 with the master clock divider 44. The rst1 output of the reset synchronizer 43 is also applied to a data input of at least one daisy chained D-type flip flop 62. The output of buffer 58 applies the Clk input signal to a clock input of the at least one daisy chained D-type flip flop 60 and to the clock input of the at least one daisy chained D-type flip flop 62 with the output of the at least one daisy chained D-type flip flop 62, rst2 coupled to a clock input of the D-type flip flop 54 of the phase skew corrector 47. The output of the D-type flip flop 54 provides a sel_inv signal to mux 46 to correct phase skew by selecting an inverse clock signal, Clks_divider_bar from the output of the slave clock divider 42.

Figure 5:
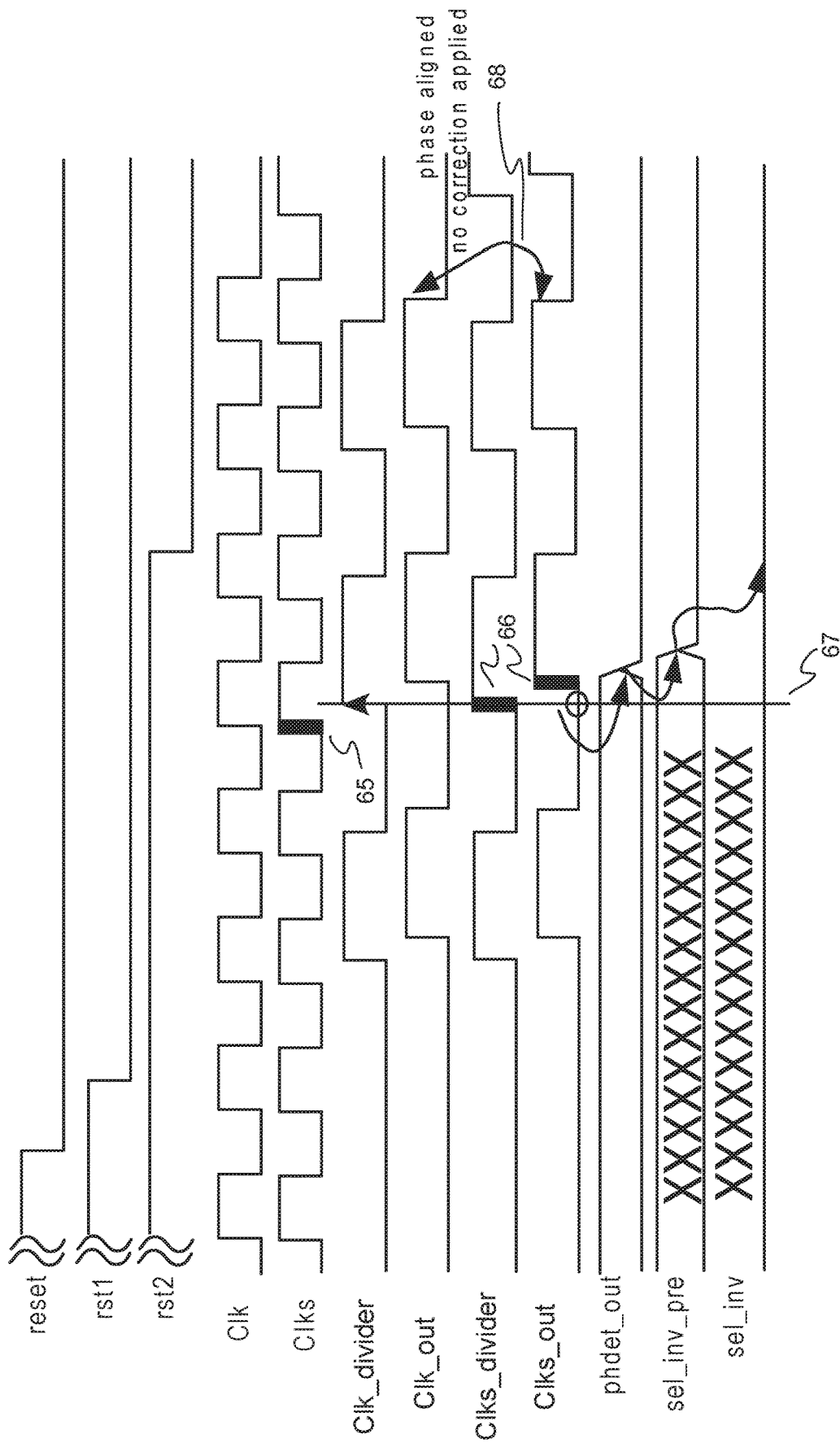
FIG. 5 illustrates a timing diagram depicting a scenario when phase skew between the input clock signals of clock dividers is within the range tolerated by both clock dividers so that the outputs from the two clock dividers are in phase.

FIG. 5 illustrates a timing diagram of the synchronizing high-speed divider 40 in accordance with the present invention depicting a scenario when phase skew is within tolerated range. The timing diagram illustrates various signal levels produced in response to input signals reset, Clk, and Clks as the high-speed divider 40 progresses through a sequence of logic states. The input Clk and Clks signals applied to the high-speed divider 40 are rectangular waveforms appearing on the fourth and fifth lines of the timing diagram in FIG. 5. It should be noted that the timing diagrams depict the high-speed divider 40 as a divide by 2 high-speed divider. Those skilled in the art will readily understand that the same concepts can be applied to high-speed dividers with other quotients. Moreover, although the present disclosure depicts two high-speed dividers, multiple dividers can also be implemented and are within the spirit of the present disclosure. As depicted in the timing diagram, the Clk and Clks signals are relatively in phase with each other with slight variance shown at 65. Accordingly, Clk divider signal generated from a rising edge of Clk, and Clks divider signal generated from a rising edge of Clks are also relatively in phase with each other. Finally, Clks_divider and Clks_out are still relatively in phase with each other as shown at 66. The high-speed divider 40 includes a phase skew detector 45 which is triggered by the rising edge of Clk_divider signal as shown by arrow 67. Since Clk_divider signal and Clk_out signal are separated by buffer delays from the deskew buffers 56, the Clk_divider signal precedes the Clk_out signal by the buffer delays. Similarly, the Clks_divider signal path to Clks_out includes buffer delays approximately equal to the buffer delays between the Clk_divider signal and Clk_out signal. In this instance, the output of Phdet_out is a low logic state as shown in the timing diagram of FIG. 5. Since Sel_inv is a logic low to mux 46 of the phase skew corrector 47, and Phdet_out is a logic low from the phase skew detector 45, the output of the XOR gate 52 continues to be a logic low selecting Clks_divider as the output for the mux 46. Accordingly, no phase skew is detected and correction is not applied, and the Clk_out signal and the Clks_out signal are in phase at arrow 68.

Figure 6:
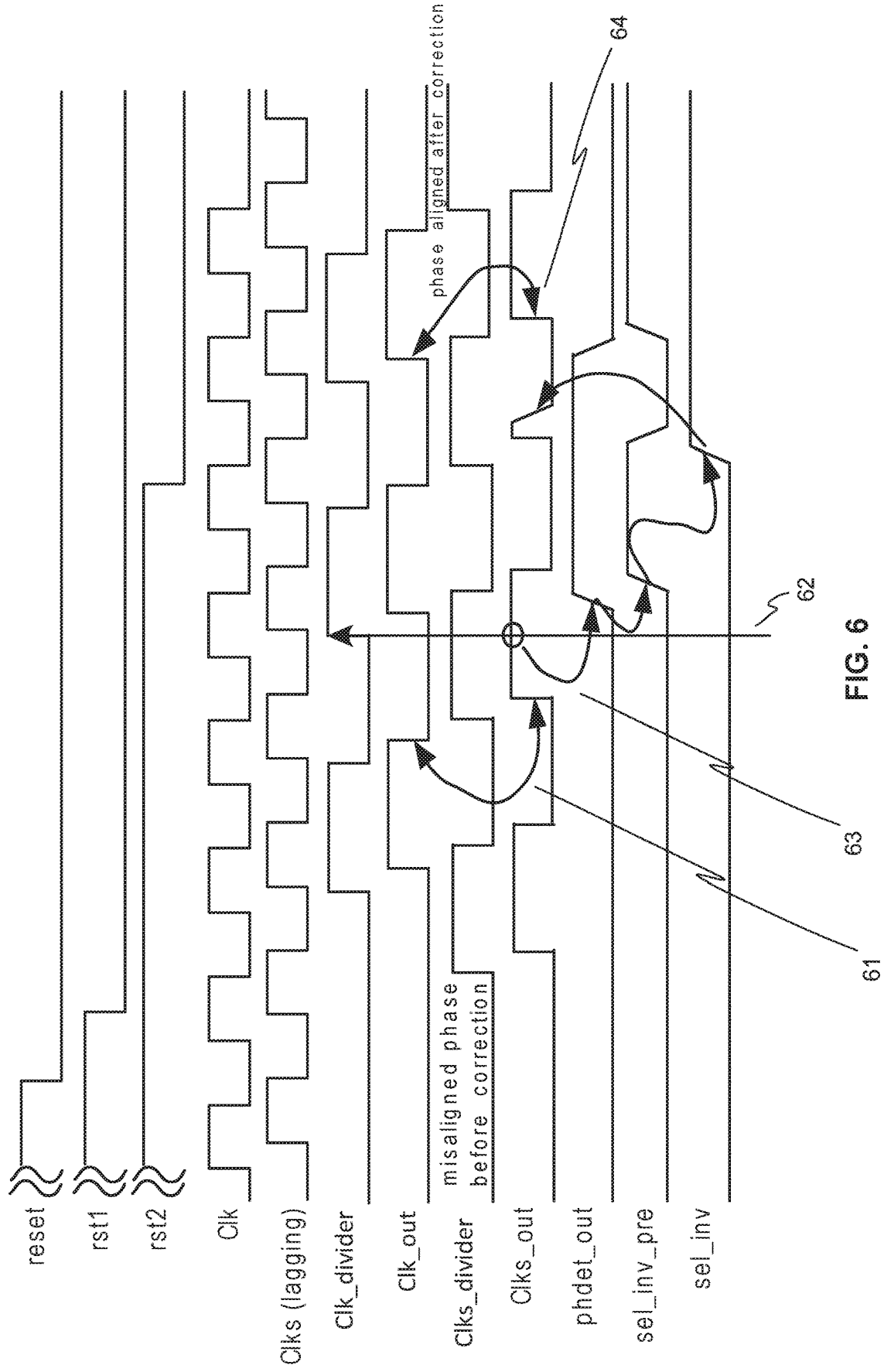
FIG. 6 illustrates a timing diagram depicting a scenario when phase skew between the input clock signals of clock dividers is beyond the hold time margin allowed by the slave clock dividers, such that the outputs from two clock dividers are out of phase, and are subsequently corrected in accordance to an embodiment of the present invention.

FIG. 6 is a timing diagram illustrating a scenario for correcting clock phase error caused by hold time violation in accordance to an embodiment of the present invention. Moreover, the timing diagram illustrates the scenario when phase skew between the input clock signals of clock dividers is beyond the hold time margin allowed by the slave clock dividers, such that the outputs from two clock dividers are out of phase, and are subsequently corrected in accordance to an embodiment of the present invention. Hold time violation can occur when the Clks waveform lags the Clk waveform. The timing diagram illustrates various signal levels produced in response to input signals reset, Clk, and Clks as the high-speed divider 40 progresses through a sequence of logic states. The input Clk and Clks signals applied to the high-speed divider 40 are rectangular waveforms appearing on the fourth and fifth lines of the timing diagram in FIG. 6. As depicted in the timing diagram, the input Clk and Clks signals are not in phase with each other. The input signal Clks lags the input signal Clk which can cause phase error between the Clk_out and the Clks_out signals as shown by intermediate timing signal Clks_divider compared with Clk_divider. Referring to arrow 61, Clk_out and Clks_out waveforms are out of phase with each other. Phase detection is triggered by the rising edge of the Clk_divider signal as shown by arrow 62. Referring now to arrow 63, the out of phase signal Clks_out is latched by the D-type flip flop 50 of the phase skew detector 45 and a positive phdet_out signal is applied to an input of the XOR gate 52 of the phase skew corrector 47. Next, the output of XOR gate 52 provides an active sel_inv_pre signal to select the other output of the mux 46 which realigns the phase for Clk_out and Clks_out as shown by arrow 64.

Figure 7:
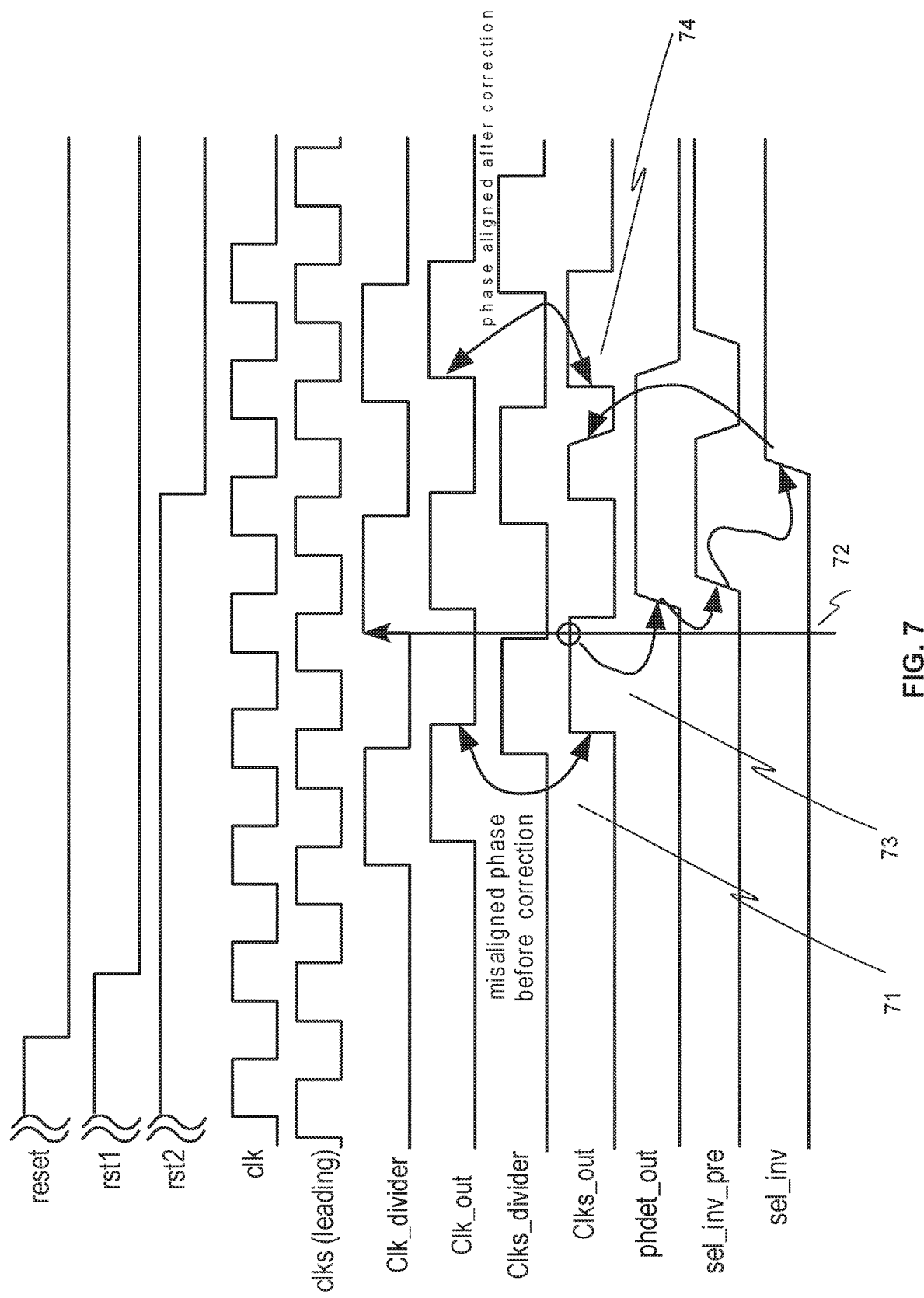
FIG. 7 illustrates a timing diagram depicting a scenario when phase skew between the input clock signals of clock dividers is beyond the setup time margin allowed by the slave clock dividers, such that the outputs from two clock dividers are out of phase, and are subsequently corrected in accordance to an embodiment of the present invention.

FIG. 7 is a timing diagram illustrating a scenario for correcting clock phase error caused by setup time violation in accordance to an embodiment of the present invention. Moreover, the timing diagram illustrates the scenario when phase skew between the input clock signals of clock dividers is beyond the setup time margin allowed by the slave clock dividers, such that the outputs from two clock dividers are out of phase, and are subsequently corrected in accordance to an embodiment of the present invention. Setup time violation can occur when the Clks waveform leads the Clk waveform. The timing diagram illustrates various signal levels produced in response to input signals reset, Clk, and Clks as the high-speed divider 40 progresses through a sequence of logic states. The input Clk and Clks signals applied to the high-speed divider 40 are rectangular waveforms appearing on the fourth and fifth lines of the timing diagram in FIG. 7. As depicted in the timing diagram, the input Clk and Clks (leading) signals are not in phase with each other. The input signal Clks leads the input signal Clk which causes phase error between the Clk_out and the Clks_out signals as shown by arrow 71. The Clk_out and the Clks_out signals are out of phase or has misaligned phase with each other. Referring to arrow 72, phase detection is triggered by the rising edge of the Clk_divider signal. Referring now to arrows 73, the output of signal Clks_out is latched by the D-type flip flop 50, and a phdet_out signal from the phase skew detector 45 is applied to an input of the XOR gate 52 of the phase skew corrector 47. Next, the output of XOR gate 52 provides an active sel_inv_pre signal to the D-type flip flop 54. The active sel_inv_pre signal is latched when the rst2 signal becomes active low. The active sel_inv signal of the D-type flip flop 54 is applied to the mux 46 of the phase skew corrector 47 to select the other output of mux 46 which realigns the phase for Clk_out and Clks_out as shown by arrow 74. Accordingly, the synchronizing high-speed clock divider 40 detects phase skew between the Clk and Clks signals. Once phase skew is detected, the high-speed clock divider also corrects the phase skew or the phase misalignment.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A synchronizing high-speed clock divider having a Clk input, a Clks input, and a reset input configured to correct phase misalignment between a Clk out signal and a Clks out signal caused by phase skew between a Clk in signal and a Clks in signal, comprising:
    a reset synchronizer configured to generate at least one synchronous internal reset signal in response to a reset signal and the Clk in signal;
    a first clock divider configured to receive the Clk in signal on the Clk input and the at least one synchronous internal reset signal on a first clock divider reset input to provide the Clk out signal;
    a second clock divider configured to receive the Clks in signal on the Clks input and the at least one synchronous internal reset signal on a second clock divider reset input to provide the Clks out signal;
    a phase skew detector coupled to the first clock divider and the second clock divider configured to detect phase alignment between the Clk out signal and the Clks out signal; and
    a phase skew corrector coupled to the phase skew detector and the second clock divider configured to change the phase alignment of the Clks out signal from the second clock divider to be within a same phase as the Clk out signal from the first clock divider in response to the phase skew detector detecting a phase misalignment between the Clk out signal and the Clks out signal.

2. The synchronizing high-speed clock divider of claim 1, wherein:
    the first clock divider includes a Clk_divider output;
    the second clock divider includes a Clks_divider output and a Clks_divider_bar output; and
    the phase skew corrector is configured to select the Clks_divider_bar output to provide the same phase as the Clk_divider output of the first clock divider.

3. The synchronizing high-speed clock divider of claim 2, wherein the phase skew detector comprises a first D-type flip flop configured to receive the Clks_out signal at a data input and the Clk_divider output at a clock input of the first D-type flip flop to detect phase misalignment.

4. The synchronizing high-speed clock divider of claim 3 further comprising a buffer coupled between the Clks_out signal and the data input of the first D-type flip flop.

5. The synchronizing high-speed clock divider of claim 3 further comprising a buffer coupled to the Clk_divider output to provide the Clk out signal.

6. The synchronizing high-speed clock divider of claim 3, wherein the phase skew corrector includes a mux configured to receive a first input from the Clks_divider output, a second input from the Clks_divider_bar output, and a selection input from an output of a second D-type flip flop to select either the first input of the mux or the second input of the mux for output in response to the phase skew detector.

7. The synchronizing high-speed clock divider of claim 6, wherein:
    the reset synchronizer generates a second synchronous internal reset signal; and
    an output of the first D-type flip flop is coupled to a first input of an XOR gate, an output of the second D-type flip flop is coupled to a second input of the XOR gate and to the selection input of the mux, and an output of the XOR gate is coupled to an input of the second D-type flip flop having the second synchronous internal reset signal coupled to a gating input of the second D-type flip flop.

8. The synchronizing high-speed clock divider of claim 7 wherein the reset synchronizer includes at least one reset D-type flip flop coupled to the reset input to provide the at least one synchronous internal reset signal in response to the Clk in signal and at least another reset D-type flip flop coupled to the at least one reset D-type flip flop to provide the second synchronous internal reset signal to the gating input of the second D-type flip flop.

9. The synchronizing high-speed clock divider of claim 8, wherein the at least one reset D-type flip flop of the reset synchronizer includes a buffer coupled between a gating input of the at least one reset D-type flip flop and the Clk in signal.

10. A method of operating a synchronizing high-speed clock divider having a Clk input, a Clks input, a reset input, a Clk output, and a Clks output configured to correct phase misalignment between a Clk out signal from a master clock divider and a Clks out signal from a slave clock divider, comprising the steps:
configuring a reset synchronizer to generate at least one synchronous internal reset signal in response to a reset signal applied to the reset input and a Clk in signal applied to the Clk input;
configuring the master clock divider to receive the Clk in signal applied to the Clk input and the at least one synchronous internal reset signal applied to a master clock divider reset input to generate a Clk_master signal;
configuring the slave clock divider to receive a Clks in signal applied to the Clks input and the at least one synchronous internal reset signal applied to a slave clock divider reset input to generate a Clks_slave signal;
detecting a phase alignment between the Clk_master signal from an output of the master clock divider and the Clks_slave signal from an output of the slave clock divider; and
correcting the phase alignment of the Clks_slave signal from the output of the slave clock divider to be within a same phase as the Clk_master signal from the output of the master clock divider.

11. The method of operating a synchronizing high-speed clock divider of claim 10, wherein the slave clock divider includes a Clks_slave_bar signal and the step of correcting the phase alignment includes the step of selecting the Clks_slave signal to correct phase alignment if no phase alignment is detected between the Clks_slave signal and the Clk_master signal.

12. The method of operating a synchronizing high-speed clock divider of claim 10, wherein the slave clock divider includes a Clks_slave_bar signal and the step of correcting the phase alignment includes the step of selecting the Clks_slave bar signal to correct phase alignment between the Clks_slave signal and the Clk_master signal.

13. The method of operating a synchronizing high-speed clock divider of claim 12, wherein the step of detecting a phase alignment includes a phase skew detector comprising a first D-type flip flop configured to receive the Clks_slave output at a data input and the Clk_master signal at a clock input of the first D-type flip-flop to detect phase skew.

14. The method of operating a synchronizing high-speed clock divider of claim 13, further comprising a phase skew corrector having a mux configured to receive a first input from the Clks_slave output, a second input from the Clks_slave_bar output, and a selection input from an output of a second D-type flip flop wherein the step of correcting the phase alignment includes the step of selecting the first input of the mux or the second input of the mux for output in response to the phase skew detector to correct the phase alignment.

15. The method of operating a synchronizing high-speed clock divider of claim 14, wherein:
the reset synchronizer generates a second synchronous internal reset signal; and
an output of the first D-type flip flop is coupled to a first input of an XOR gate, an output of the second D-type flip flop is coupled to a second input of the XOR gate, and to the selection input of the mux, and an output of the XOR gate is coupled to a data input of the second D-type flip flop having the second synchronous internal reset signal coupled to a clock input of the second D-type flip flop.

16. The method of operating a synchronizing high-speed clock divider of claim 15, wherein the reset synchronizer includes:
at least one reset D-type flip flop coupled to the reset input to provide the at least one synchronous internal reset signal to the master clock divider and the slave clock divider in response to the Clk in signal; and
at least another reset D-type flip flop coupled to the at least one synchronous internal reset signal of the at least one reset D-type flip flop to provide the second synchronous internal reset signal to the clock input of the second D-type flip flop in response to the Clk in signal.

17. The method of operating a synchronizing high-speed clock divider of claim 16 further comprising a buffer coupled between the Clk in signal and gating inputs of the at least one reset D-type flip flop and the at least another reset D-type flip flop.

18. A synchronizing high-speed clock divider having a Clk input, a Clks input, a reset input, a Clk output, a Clks output, and a Clks_bar output configured to correct phase misalignment between a Clk out signal and a Clks out signal caused by phase skew between a Clk in signal and a Clks in signal, comprising:
a reset synchronizer configured to generate a first synchronous internal reset signal and a second synchronous internal reset signal in response to a reset signal and the Clk in signal;
a first clock divider configured to receive the Clk in signal on the Clk input and the first synchronous internal reset signal on a first clock divider reset input to provide the Clk out signal at the Clk output;
a second clock divider configured to receive the Clks in signal on the Clks input and the first synchronous internal reset signal on a second clock divider reset input to provide the Clks out signal at the Clks output and a Clks_bar out signal at the Clks_bar output;
a phase skew detector coupled to the first clock divider and the second clock divider configured to detect phase misalignment between the Clk out signal and the Clks out signal; and
a phase skew corrector coupled to the phase skew detector and the second clock divider configured to correct phase misalignment by selecting the Clks_bar out signal of the second clock divider in response to the second synchronous reset signal and the phase skew detector detecting a phase misalignment between the Clk out signal and the Clks out signal.

19. The synchronizing high-speed clock divider of claim 18, wherein the phase skew detector includes a D-type flip flop configured to receive the Clks out signal at a data input and the Clk out signal at a gating input to determine whether there is phase misalignment.

20. The synchronizing high-speed clock divider of claim 18, wherein the reset synchronizer includes a plurality of serially coupled D-type flip flops responsive to the reset signal at a data input and the Clk in signal simultaneously applied to gating inputs of the serially coupled D-type flip flops to provide the first synchronous internal reset signal at an intermediate output and the second synchronous internal reset signal at a final output.

* * * * *